US012622007B1

(12) United States Patent (10) Patent No.: US 12,622,007 B1
Tarof et al. (45) Date of Patent: May 5, 2026

(54) TYPE I-II TRANSISTOR WITH A MANUFACTURABLE LEDGE

(71) Applicant: ElectroPhotonic-IC Inc., Kanata (CA)

(72) Inventors: Lawrence E. Tarof, Kanata (CA); Barry Wu, Kanata (CA); Dhiraj Kumar, Redondo Beach, CA (US); Milton Feng, Kanata (CA)

(73) Assignee: ElectroPhotonic-IC Inc., Kanata (CA)

( * ) Notice: Subject to any disclaimer, the term of this patent is extended or adjusted under 35 U.S.C. 154(b) by 0 days.

(21) Appl. No.: 19/275,036

(22) Filed: Jul. 21, 2025

Related U.S. Application Data

(60) Provisional application No. 63/822,383, filed on Jun. 12, 2025.

(51) Int. Cl.
| | |
|---|---|
| *H10D 10/80* | (2025.01) |
| *H01S 3/107* | (2006.01) |
| *H10D 10/01* | (2025.01) |
| *H10D 62/824* | (2025.01) |
| *H10F 30/223* | (2025.01) |
| *H10F 39/10* | (2025.01) |
| *H10F 77/124* | (2025.01) |
| *H10F 77/40* | (2025.01) |

(52) U.S. Cl.
CPC ........... *H10D 10/821* (2025.01); *H01S 3/107* (2013.01); *H10D 10/021* (2025.01); *H10D 62/824* (2025.01); *H10F 30/223* (2025.01); *H10F 39/103* (2025.01); *H10F 77/1248* (2025.01); *H10F 77/413* (2025.01)

(58) Field of Classification Search
None
See application file for complete search history.

(56) References Cited

U.S. PATENT DOCUMENTS

| | | | | |
|---|---|---|---|---|
| 7,868,335 B1* | 1/2011 | Li | ........................ | H10D 62/605 |
| | | | | 257/E29.189 |
| 10,651,298 B2* | 5/2020 | Chin | .................... | H10D 62/137 |
| 2003/0032253 A1* | 2/2003 | Nguyen | ............... | H10D 62/824 |
| | | | | 257/E29.189 |
| 2006/0284282 A1* | 12/2006 | Cunningham | ....... | H10D 62/165 |
| | | | | 257/E29.189 |
| 2023/0006056 A1* | 1/2023 | Kwok | .................. | H10D 10/821 |

OTHER PUBLICATIONS

Xu, H et al.; "Advanced Process and Modeling on 600+ GHz Emitter Ledge Type-II GaAsSb/InP DHBT"; Technical Digest—IEEE Compound Semiconductor Integrated Circuit Symposium, CSIC; Dec. 5, 2014; 5 pages.

* cited by examiner

*Primary Examiner* — Khaja Ahmad

(74) *Attorney, Agent, or Firm* — Miltons IP/p.i.

(57) ABSTRACT

A transistor comprising a plurality of semiconductor layers arranged to form a base, an emitter and a collector wherein the emitter is of a first semiconductor material and comprises an emitter ledge being made from a material which is selectively etchable relative to the emitter or base material to produce the emitter ledge that is lattice matched.

28 Claims, 6 Drawing Sheets

| EM |
|---|

| SiN_x | InGaAs Contact | SiN_x |
| | Heavily Doped InP | |

Lightly Doped AlInP

Emitter Ledge

GaAsSb Base

InP Collector

200

| EM Contact Layer | — 218 |

| 216 — | SiN_x | InGaAs Contact | SiN_x | — 214 |
| | | Heavily Doped InP | | — 212 |

210a

209

202

211

Etch Selective Material — 210

208

210b

GaAsSb Base — 206

InP Collector — 204

Photonics Layers

Electronics Layers

Epitaxia Layer Structure

800

Monolithically Integrated
EAM and EAM Driver chip
800

EAM
820

EAM
Driver

830

Direct on-chip
Interconnection of
EAM and EAM Driver

EAM
820 i p n

EAM epi-layers
808

800

830 epi-layers for
InP HBTs of
EAM Driver
804

Spacer
806

EAM Driver

802

SI InP Subtrate

Photonics Area
812

Electronics Area
814

Fig. 9

TYPE I-II TRANSISTOR WITH A MANUFACTURABLE LEDGE

CROSS-REFERENCE TO RELATED APPLICATION(S)

This application claims the benefit of U.S. provisional patent application No. 63/822,383 entitled "A TYPE I-II TRANSISTOR WITH A MANUFACTURABLE LEDGE" filed on Jun. 12, 2025 and is related to U.S. provisional patent application No. 63/822,340 entitled "A TYPE I-II TRANSISTOR FOR HIGH-SPEED APPLICATIONS" filed on Jun. 12, 2025.

FIELD OF THE INVENTION

The present invention relates generally to a type I-II transistor with a manufacturable ledge, particularly but not exclusively to a Double Heterojunction Bipolar Transistor (DHBT).

BACKGROUND

A DHBT is a type of bipolar junction transistor (BJT) that uses different semiconductor materials for the emitter and base regions, creating a heterojunction. DHBTs can be made of different types of semiconductor materials. This is particularly the case as data communication technology advances, and speed of operation continues to be pushed beyond the current norms, e.g. next generation high-speed modulation schemes 112 GB, 224 Gb/s PAM4 modulation, 224 GB, 448 Gb/s PAM4 modulation applications, any high-speed data interconnects within data centers and between data centers, passive optical networks (PON), 5G network communications (i.e. optical core network connected to 5G wireless access) and the like.

Many different type of transistors have been suggested in the art, and many suffer from inherent problems. Seeking a high-speed transistor has led to various proposals. Si-based HBT (SiGe) and III-V based HBT suffer from gain (β) problems which has mean that they are not suitable for high-speed applications. In III-V compound semiconductors there is a differentiation between Type-I and Type-II transistors, based on the difference of conduction band energy $E_c$ between the emitter and the base layers which also affects performance at high-speeds. A semiconductor heterojunctions behaves based on the alignment of the energy bands at an interface between materials and thus on energy band offsets. The interfaces of such heterojunctions can be categorized in three types: straddling gap (referred to as type I), staggered gap (type II), and broken gap (type III).

In some cases, use of Type-I and Type-II transistors have been used but problems have been encountered. Pure Type II transistors have a drawback of electron blocking from the emitter to the base. M.Feng, B. Wu et al. proposed a Type I-II transistor to alleviate this drawback relying on a graded composition Indium Aluminum Phosphide InAlP emitter-base connection. This suffers from further problems including but not limited to fabrication problems, maintaining an acceptable conduction band alignment and ensuring gain is at a level which works in high-speed applications.

There is also a suggestion of etching a ledge into the emitter layer for passivation of the extrinsic base surface between the emitter mesa and the base contact metal. The consistent manufacture of such a ledge has proved to be difficult to manufacture and reproduce consistently.

Another important factor in transistors for high-speed applications is in ensuring there is an optimal relationship between current gain cutoff frequency ($f_T$) and breakdown voltage (BV). The curve (often referred to as the "Johnson Curve") of BV against $f_T$ needs to reach a higher contour than is possible with CMOS- and Si-technology-based materials. Accordingly, it is interesting for high-speed applications to use Type-I and/or Type-II transistors.

A still further factor is the use of different materials in an integrated monolithic device, for example, as used in integrated photonics and electronics devices. These can be made of different materials including but not limited to InP based materials. InP based devices tend to outperform SiGe based devices in many situations, and it is known there are difficulties in making devices combining InP and SiGe based materials. As a result, a monolithic device including photonics and electronics in InP is a sought combination.

There are continued problems in overcoming the requirements needed for optimal operation of Type-I and Type-II DHBTs using appropriate materials in high-speed applications. For the avoidance of doubt the nature of high-speed applications includes, but are not limited to high-speed modulation schemes such as 112 GB, 224 Gb/s PAM4 modulation, 224 GB, 448 Gb/s PAM4 modulation applications, any high-speed data interconnects within data centers and between data centers, passive optical networks (PON), 5G network communications (i.e. an optical core network connected to 5G wireless access) and the like.

BRIEF SUMMARY

The present invention addresses an improved DHBT which overcomes or mitigates at least some of the problems with known approaches and which is suitable next generation high-speed modulation schemes 112 Gb/s, 224 Gb/s PAM4 modulation, 224 Gb/s, 448 Gb/s PAM4 modulation applications, any high-speed data interconnects within data centers and between data centers, passive optical networks (PON), 5G network communications (i.e. an optical core network connected to 5G wireless access) and the like.

According to a first aspect, there is provided;

An HBT transistor comprising a plurality of semiconductor layers arranged to form a base, an emitter and a collector wherein the emitter is of a first semiconductor material and comprises an emitter ledge being made from a material which is selectively etchable relative to the emitter or base material to produce the emitter ledge that is lattice matched.

According to an aspect for an HBT transistor fabricated with an InP-based materials system, the material which is selectively etchable relative to the emitter or base material is an aluminum containing quaternary material (Al-Q) and the selected A-Q material is selected by selecting the ledge material to be selectively etchable such that the etching process is consistent for a predetermined combination of a ledge material and the emitter material.

According to an aspect the selected Al-Q material is selected by selecting the ledge material and the emitter material to be substantially lattice matched.

According to an aspect selecting the materials from a set of Al-Q material is selected by selecting a conduction band energy similar to the conduction band energy at a point in the emitter layer adjacent to the ledge etch point.

According to an aspect selecting a conduction band energy similar to the point in the emitter layer to the ledge etch point is for a specific composition of InAlP.

According to an aspect selecting the materials from a set of Al-Q material is selected by selecting a position within the emitter material at which a conduction band energy is matched with the conduction band energy of the selected Al-Q material.

According to an aspect the emitter ledge comprises a bulk material or a superlattice material.

According to an aspect the superlattice material comprises a chirped superlattice.

According to an aspect the emitter ledge is configured to be made at a top of a selective etch material by etching from above.

According to an aspect the emitter ledge is configured to be made at a bottom of a selective etch material by etching from below.

According to an aspect the emitter ledge has a predetermined profile.

According to an aspect the predetermined profile the includes at least two sloped regions separated by the emitter ledge.

According to an aspect the predetermined profile includes at least variations in one or more shape, size, material and form.

According to an aspect the emitter ledge comprises a graded emitter including a lightly doped AlInP layer and an etch selective material through the lightly doped AlInP layer.

According to an aspect the etch selective material comprises an GaAs(x)Sb(1-x).

According to an aspect the emitter ledge layer is made from InGaAlAs ("Al-Q") sandwiched between In(1-x)Al(x) P.

According to an aspect the layers on at least one side of the emitter ledge layers comprise an arsenide-based material.

According to an aspect the arsenide-based material comprises GaAs(x) Sb (1-x).

According to an aspect the arsenide-based material are on either side of the emitter ledge layers.

According to an aspect the transistor is one of a Transimpedance Amplifier (TIA) and an Electro-Absorption Modulator (EAM) driver in a transmitter.

According to a second aspect of the invention there is provided an optical receiver comprising a monolithically integrated photodiode (PD) and a transistor to another aspect.

According to an aspect the transistor comprises a Transimpedance Amplifier (TIA).

According to an aspect an epitaxial layer stack is formed on a semi-insulating (SI) InP substrate;

the TIA comprises a heterojunction bipolar transistors (HBT) formed by a first plurality of semiconductor layers of the epitaxial layer stack formed on the SI substrate;

the PD comprises a p-i-n diode (PIN) formed by a second plurality of semiconductor layers of the epitaxial layer stack overlying the first plurality of semiconductor layers, the second plurality of semiconductor layers comprising an n-layer, an i-layer and a p-layer; and a p-contact of the PIN diode is directly interconnected by a conductive trace to an input of the TIA.

According to an aspect further comprising a spacer comprising one or more intermediate layers between the first plurality of semiconductor layers and the second plurality of semiconductor layers.

According to an aspect the spacer comprises a semi-insulating layer.

According to an aspect the TIA is formed on a first area of the substrate, and the PIN is provided on an adjacent area, and comprising an isolation region electrically isolating the first plurality of semiconductor layers of the first area from the first plurality of semiconductor layers of the adjacent area.

According to a third aspect of the invention there is provided an optical transmitter comprising a monolithically integrated Electro-Absorption Modulator (EAM) and a transistor of another aspect.

According to an aspect the transistor comprises Electro-Absorption Modulator (EAM) driver.

According to an aspect, further comprising a plurality of semiconductor layers formed on a semi-insulating (SI) substrate, plurality of semiconductor layers comprising a first plurality of semiconductor layers defining an optical waveguide forming at least part of the EAM; and a second plurality of semiconductor layers comprising EAM driver layers.

According to an aspect further comprising a spacer separating the first plurality of semiconductor layers from a second plurality of semiconductor layers.

According to an aspect further comprising a laser.

According to a third aspect of the invention there is provided a monolithically integrated Mach-Zehnder modulator (MZM) and a transistor of another aspect.

According to a fourth aspect of the invention there is provided an optical system comprising an optical transmitter of another aspect.

According to an aspect an optical receiver is provided.

According to a fourth aspect of the invention there is provided a method a manufacturing a transistor the method comprising:

growing a collector and a base.

forming a graded emitter over the base;

providing an etch selective material intermediately through the graded emitter;

etching in a selective manner by a wet etch process the graded emitter and the etch selective material to form an emitter ledge at an intermediate position in the graded emitter.

According to an aspect further comprising growing the collector and base by one or more epitaxial growth process stages.

According to an aspect further comprising forming a graded emitter over the base from a combination of layers.

According to an aspect further comprising forming the graded emitter to comprise a lightly doped AlInP layer and a heavily doped InP layer According to an aspect further comprising etching selective to the graded emitter or the base by an etchant that works selectively on the materials of the graded emitter or the base.

According to an aspect further comprising selecting the etch selective material, so that a selective wet etch can be used to selectively etch layers define the emitter ledge reliably and controllably.

According to an aspect the epitaxial process comprises one of a molecular-beam epitaxy (MBE) process or a Metal Organic Chemical Vapor Deposition (MOCVD) process.

According to an aspect the etch selective material comprises and Al-Q material.

According to an aspect the etch selective material comprises InGaAlAs.

According to an aspect made of layers included in the table:

| Description | Material |
| --- | --- |
| Emitter metal | Ti/Pt/Au |
| Cap | In(x)Ga(1-x)As |
| Emitter | InP |
| Emitter | In(1-x)Al(x)P |
| Emitter etch selective layer | AlInGaAs (Al-Q) |
| Emitter/ledge | In(1-x)Al(x)P |
| Base | GaAs(x)Sb(1-x) |
| Collector | InP |
| Sub-collector | InP |
| Sub-collector | In(x)Ga(1-x)As |
| Sub-collector | InP |
| Etch stop | In(x)Ga(1-x)As |
| Substrate | InP (SI) |

According to an aspect a transistor is made according to another aspect.

It will be appreciated that any combination of the aspects above can be combined with any other aspects to form combinations not specifically stated in the claims or description.

While example aspects of monolithically integrated devices or various types as described herein, the design methodology may be extended to other forms of device implemented using InP-based materials process technology. Design parameters may be optimized to provide an integrated device such as receiver, a transmitter, an ONU or OLT for 10G PON, or for other applications requiring high data rate optical detectors for applications such as CWDM for high-speed data interconnect, 5G network communications.

Other applications may include 5G and database technology using multiple wavelengths, although the wavelengths of operation may be somewhat different from PON. The proposed technologies and methodologies may apply to other lower speed operations such as currently deployed 506 GB, 112 Gb/s PAM4 data communications.

Another aspect of the invention provides a method of fabrication of device structures, comprising monolithically integrated devices for optical receivers, transmitters and transceivers as disclosed herein.

The foregoing and additional aspects and aspects of the present invention will be apparent to those of ordinary skill in the art in view of the detailed description of various aspects and/or aspects, which is made with reference to the drawings, a brief description of which is provided next.

The foregoing and additional aspects and aspects of the present invention will be apparent to those of ordinary skill in the art in view of the detailed description of various aspects and/or aspects, which is made with reference to the drawings, a brief description of which is provided next.

BRIEF DESCRIPTION OF THE DRAWINGS

FIG. 9 shows a schematic functional block diagram of an optical distribution networks according to an aspect of the present invention.

Figures 1, 2:
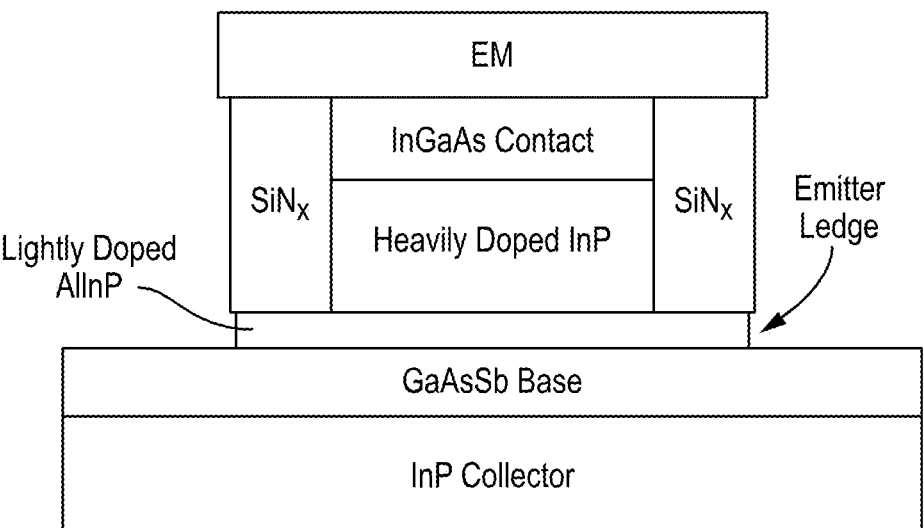
FIG. 1 is a schematic cross-sectional diagram of the layers of a known transistor.
FIG. 2 is a schematic cross-sectional diagram of the first stage of creating a layer structure of a transistor according to an aspect of the present invention.

While the present invention is susceptible to various modifications and alternative forms, specific aspects or implementations have been shown by way of example in the drawings and will be described in detail herein. It should be understood, however, that the invention is not intended to be limited to the particular forms disclosed. Rather, the invention is to cover all modifications, equivalents, and alternatives falling within the scope of an invention as defined by the appended claims.

DETAILED DESCRIPTION

The present invention relates to an HBT such as a DHBT Type I-II transistors which preserves the conduction band alignment essential for electron transport in, for example, an NPN transistor. In addition, the invention addresses the problems associated with allowing for higher gain which improves the Johnson curve performance optimization necessary for high-speed modulation applications. In addition, a monolithically integrated device is possible as the photonics and electronics can both be fabricated using an InP-based materials system, and thus provide considerable further advantages.

There are a number of variations described below which seek to address the requirements necessary to implement a transistor which is suitable for the high-speed modulation technologies such as 112 GB, 224 Gb/s PAM4 modulation, 224 GB, 448 Gb/s PAM4 modulation applications, any high-speed data interconnects within data centers and between data centers, passive optical networks (PON), 5G network communications (i.e. an optical core network connected to 5G wireless access) and the like. All variations and alternatives are intended to be included within the reasonable scope of the appended claims.

FIG. 1 shows an example of a known transistor having a layered structure. The layers comprise a collector comprising InP, a base comprising GaAsSb and an emitter comprising multiple layers. The emitter comprises an emitter ledge formed from AlInP. The material of the emitter ledge is lightly doped and is formed by depositing or otherwise growing a layer of AlInP and then etching the AlInP layer to form the ledge. There are a number of problems with this. AlInP is very difficult to etch in a controlled manner. There is little or no way of controlling the degree to which the ledge is etched and as a result the dimensions and intrinsic replicability of the ledge are impossible to regulate. Timed etching, such as timed wet etching, alone has not proved an effective way to form a ledge in Type I-II transistors. As a result, manufacturing such a device is unpredictable and unrepeatable in a fabrication environment.

It should be understood that the foregoing and following electro-photonic implementations may be based on Group III-V semiconductor materials, such as an Indium Phosphide (InP)-based material system comprising binary, ternary, quaternary and other compositions of In, Ga, As, P, Al and Sb. Type I-II transistors may be made of similar materials and the like. In addition to traditional group III-V semiconductors, devices may further comprise B, Ti, N, Bi. Nitride based semiconductor materials may be more difficult to make into an HBT because of limited options for P-doping.

Different types of transistor have different "Johnson curves" for a graph of breakdown voltage (BV) versus frequency cutoff ($F_T$). The most interesting of these is the InP type II transistors, which appear to provide an optimal transistor for 448 Gb/s PAM4 modulation applications. The present invention provides a type I-II HBT transistor having a manufacturable emitter ledge that would provide a performance that would satisfy the requirements of 448 Gb/s PAM4 modulation applications.

The electronics including a transistor optimized for 448 Gb/s PAM4 modulation applications may be based on InP-based hetero-junction bipolar transistors, which may be monolithically integrated with any required photonic components. Alternatively, the photonics may be hybrid, integrated or co-packaged with other electronics, such as CMOS silicon-based electronics. Generally, suitable electro-optical and electronic material-based processes are contemplated for the high-speed applications by the aspects of the invention which follow.

The electronics may include one or more transistors optimized for 448 Gb/s PAM4 modulation applications arranged with other circuitry to carry out the relevant functionality of a circuit or system. Each transistor may be a hetero-junction bipolar transistor such as a Double Heterojunction Bipolar Transistor (DHBT). In examples the electronics may be a Transimpedance Amplifier (TIA) in an optical receiver comprising DHBTs and an Electro-Absorption Modulator (EAM) driver in an optical transmitter. Other components may be included as required.

In an aspect of the present invention there is provided an InP HBT transistor 200 which is designed to have an optimal current gain, β and is a Type I-II transistor as shown in FIG. 2. The transistor 200 is grown on a semi insulating (SI) III-V material substrate (not shown). In an example this substrate is semi-insulating InP. A plurality of electronic layers 202 are grown to provide a first plurality of semiconductor layers for at least one transistor comprising an InP DHBT in an example. A semi-insulating substrate is beneficial in fabrication as there is reduced overall capacitance which improves electrical performance. In order that a transistor has an optimal current gain certain criteria must be met. These include, but are not limited to a proper combination of base composition, doping, and thickness in the Epitaxial layers (EPI), and proper device fabrication processes to ensure good ledge thickness and/or length, and appropriate passivation of the emitter ledge structure. In addition, the ledge and the manner of manufacture ensures that a highest possible gain within a given target for resistance of the base $R_b$ is enabled. This is important due to the monotonic relationship between $R_b$ and transistor gain β and to ensure optimal high-speed operation of the transistor.

Figure 3:
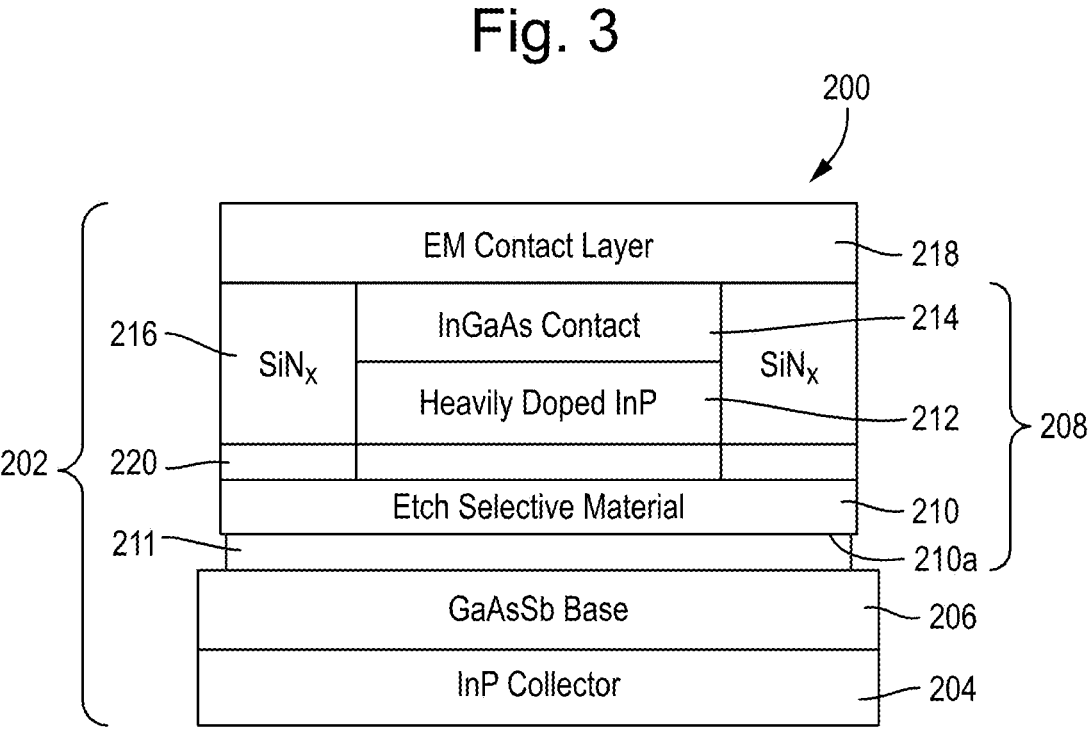
FIG. 3 is a schematic cross-sectional diagram of the first option of a processing option of the layer structure of the FIG. 2 transistor according to an aspect of the present invention.
Figure 4:
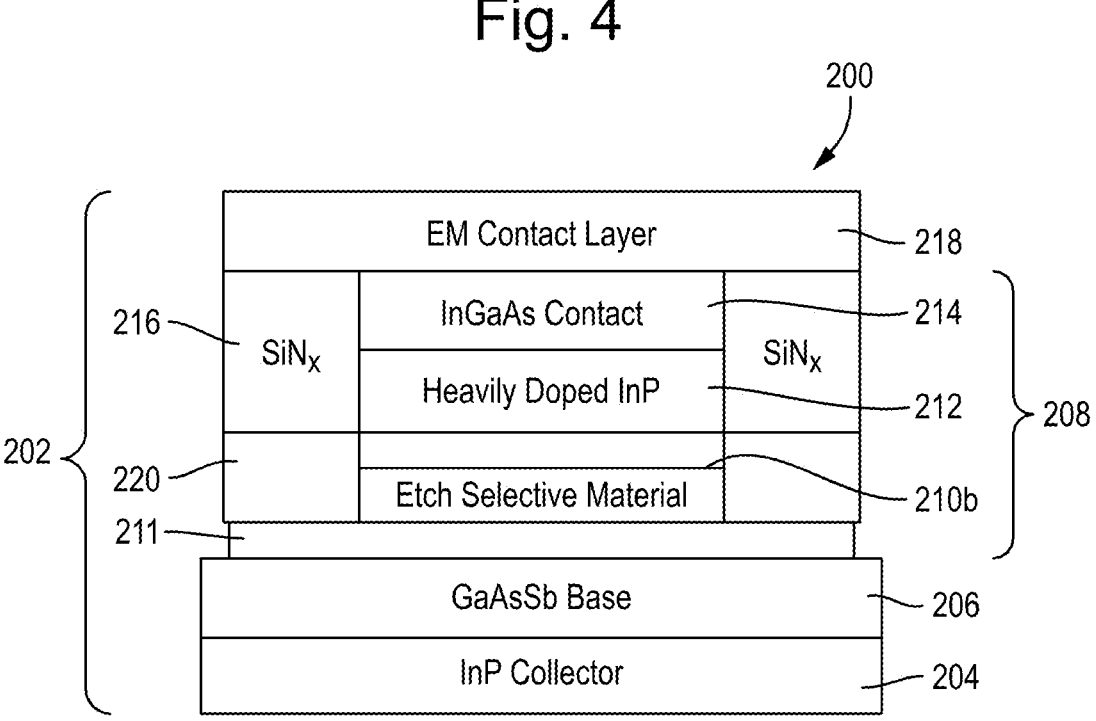
FIG. 4 is a schematic functional diagram of the second option of a processing option of the layer structure of FIG. 2 according to an aspect of the present invention.

When making smaller transistors (with higher perimeter to area ratio) the reduction of the leakage current through the periphery becomes important. Higher leakage current through the periphery lowers the current gain, sometimes significantly, if the process design is flawed. An approach to address this in HBT processing is to create the emitter ledge 211. As indicated herein, this requires the doping to be low enough, the thickness to be thin enough, the length to be long enough, and the pinning of the surface trap of the interface between the ledge and the spacer to be determined so that at the bias range of interest the emitter ledge stays depleted of electrons. The interface is shown in FIGS. 3 and 4, between layer 209 and filled void 220. This suppresses the leakage current and keeps the current gain high. The current gain becomes a bulk property which depends on the doping of the base (related to $R_b$) and the thickness of the base. Both base doping and base thickness have great impact on device speed. The higher the base doping the lower the beta, and the thicker the base the lower the beta.

The plurality of electronic layers 202 include a collector (C) 204, a base (B) 206 and an emitter (E) 208. The collector 204 includes a number of different layers including, by way of example, InP, B/C AlInGaAs chirped superlattice (CSL), In(x)Ga(1-x)As. A CSL is only needed when B/C junction is type I. In GaAsSb/InP B/C junction is type II so CSL is not needed. The base 206 comprises a layer of GaAsSb in an example. The emitter comprises multiple layers forming a graded InAlP emitter 208. The graded emitter comprises a lightly doped AlInP emitter layer 209, an etch selective material 210 is located or disposed intermediately, within the lightly doped AlInP layer 209. For example, in the middle or elsewhere as required for the design requirements. The graded emitter comprises a heavily doped InP layer 212; an InGaAs contact 214; a spacer 216 and an overlying emitter metal layer 218 which acts as an etching mask. The etch selective material 210 is located or disposed within lightly doped AlInP emitter layer 209. The etch selective material 210 comprises an aluminum containing quaternary materials (Al-Q) such as InGaAlAs ("Al-Q") in an example. Table 1 below shows examples of materials and approximate layer thickness ranges for at least some of the layers in the FIGS. 2 to 4 transistor. The details in the table are shown as an example and none of the variables are anything more than exemplary and not intended to be limiting. In this example the Al contact is graded throughout such that x_A1=0 at the upper InP interface and reaches its maximum Al concentration at the InAlP-GaAsSb interface, with sufficient Al at this second interface to create a Type I junction—i.e. the conduction band edge of the InAlP is higher than that of the GaAsSb (e.g. see bandgap energy diagram in FIG. 5).

TABLE 1

| Layer | Description | Example Material | Thickness (Å) | Dopant |
|---|---|---|---|---|
| 218 | Emitter metal | Ti/Pt/Au | | Si |
| 214 | Cap | In(x)Ga(1-x)As | ~500 | Si |
| 212 | Emitter | InP | ~300 | Si |
| 209 | Emitter | In(1-x)Al(x)P | ~50 | Si |
| 210 | Emitter etch selective layer | AlInGaAs (Al-Q) | ~100 | Si |
| 211 | Emitter/ledge | In(1-x)Al(x)P | ~100 | Si |
| 206 | Base | GaAs(x)Sb(1-x) | ~200 | C |
| 204 | Collector | InP | ~750 | Si |
| Not shown | Sub-collector | InP | ~300 | Si |
| Not shown | Sub-collector | In(x)Ga(1-x)As | ~250 | Si |

TABLE 1-continued

| Layer | Description | Example Material | Thickness (Å) | Dopant |
|-------|-------------|------------------|---------------|--------|
| Not shown | Sub-collector | InP | ~3,500 | Si |
| Not shown | Etch stop | In(x)Ga(1-x)As | ~100 | |
| Not shown | Substrate | InP(SI) | | |

The etch selective layer 210 is made from InGaAlAs ("Al-Q" where this abbreviation indicates an Al containing quaternary semiconductor material selected from InP-based semiconductor materials), or in examples other arsenide-based material and formed within the graded emitter sandwiched between In(1-x)Al(x)P. The layer 210 is etch selective to the Type I AlInP emitter and the GaAsSb base. Other materials such as InP; In(1-x)Al(x)P; InAl(x)As; In(1-x)Al (x)P and the like may be used in layers adjacent to the etch selective layer. The etch selective material 210, disposed within layer 209, is chosen so that a selective wet etch can be used to selectively etch layers 209 and 210 to define an emitter ledge 211 reliably and controllably A selective wet etch is used between arsenide-based materials and phosphide-based material and a robust emitter ledge structure is formed. The ledge is considered to be useful for providing a controlled surface passivation technique for the emitter layers. This is important to protect layers from being affected by degradation caused by environment or use.

In selecting AlInGaAs as the etch selective layer 210, then the layers sandwiching it would be phosphides (including one of the group of InP, AlInP, InGaP, etc.). In selecting phosphides (for example, AlInGaP) as the etch selective layer 210, then the sandwich layers should be arsenide based (for example, Al-Q). This is for etch selectivity, using known wet etches for these materials. It is further noted, the conduction band alignment of InAlAs lattice matched, or nearly lattice matched, to InP is 100 meV higher than InP This is not exactly the same as InP, but in lattice matching terms is considered to be adequate. In some cases, a slight mismatch has advantages.

The AlInP is an example of a ledge layer (211 layer on top of the base 206). It would also be possible to use AlInAs as the ledge (layer 211), if a phosphide layer (for example, InP) is used as the etch selective layer (210).

Al-Q indicates an Al containing quaternary semiconductor material selected from InP-based semiconductor materials, such as III-V materials and including In, Ga, As, P, Al, Sb, B, Ti, N, Bi, as examples. These may comprise a bulk material or a superlattice-based material.

Selective etching occurs as the materials have different etch rates for each given etchant. In the present invention as an example the etchant is one which etches the phosphide-based material to produce the required ledge 211 having a form as described below. The etchant also etches arsenide-based materials but to a significantly lesser extent. By controlling the material used to etch these layers and the timing of the etching process, different profiles of ledge structure can be formed in the emitter ledge layer whilst preserving more (etching less) of the layers above and below the emitter ledge layer. The profile of the ledge may further be designed or predetermined and include variations in one or more of which includes for example shape, size, material, form and the like.

The emitter ledge 211 can be made by the etch selective material being provided at the top 210a of or the bottom

210b of the emitter by etching from above or from below. An example of each is shown in FIGS. 3 and 4. The temperature, chemicals and atmosphere during fabrication are controlled to etch the required ledge in the upper or lower surface.

The ledge 211 is a layer of semiconductor (or dielectric) that can create a surface pinning energy so that the semiconductor ledge is depleted of conducting electrons under the intended bias conditions. This reduction of conducting electrons reduce the electron-hole recombination at the region and therefore reduce the overall base recombination current (part of base current Ib) and improve the beta (which is collector current Ic divided by Ib). In the dielectric ledge case, the dielectric is located on the Base which can make the ledge length relatively short which can give rise to a low base resistance HBT. A ledge with more uniform thickness is more effective, if the thickness is under certain predetermined value, which depends on the pinning energy of the surface. Shapes of the profile of the ledge in cross section include a flat rectangle, a wedge ledge or any other combination of sloped and flat regions as noted above. The flat rectangular profile is the preferred profile in some examples. In addition, the ledge and the manner of manufacture ensures that a highest possible gain within a given target for resistance of the base $R_b$ is enabled. This is important due to the monotonic relationship between $R_b$ and transistor gain $\beta$ and to ensure optimal high-speed operation of the transistor.

The etch selectivity of the etchants (or wet etching solution) may come from the group V elements (As or P, or Arsenide or Phosphide materials). There are etchants which will etch Arsenide materials but not Phosphide materials and vice versa. In aspects of the invention the selective etch materials may be interchanging layers of Arsenide materials (InAlGaAs in an example) and Phosphide materials (InAIP in an example).

In simple terms the transistor of one or more aspect of the present invention can be made in accordance with the following method steps. At a high-level, the processing steps are to create at least some of the semiconductor layers of the transistor according to an aspect of the invention. Those process steps that are described can be varied in order and detail and similarly those not described will be adapted to fit with any variations and details of those steps described herein. Further any processing steps will comply to the nature of the materials used in the relevant design and could be different depending on the use case and design requirements.

In an epitaxial growth process stage, an InP semi-insulating (SI) substrate is used to grow a sub-collector, a collector and a base. The sub-collector comprises a combination of InP and In(x)Ga(1-x)As material and the collector 204 comprises InP material in an example. The base is grown from GaAs(x)Sb(1-x) in an example. A graded InAIP 208 emitter is grown in a further epitaxial growth process stage. The graded emitter is formed to comprise a lightly doped AlInP layer, a heavily doped InP layer; an InGaAs contact; a spacer and an overlying emitter metal layer which may act as an etching mask for some parts of the process. In an alternative the grade emitter may be formed by forming a suitable superlattice structure as described below.

In a further phase, an etch selective material is disposed, for example by deposition or growing, intermediately within the lightly doped AlInP layer of the emitter. This may occur at a known moment in the growth process or may be a separate step between other growth steps, The etch selective material 210 is configured to be disposed within lightly doped AlInP emitter layer 209 and may be positioned within the graded emitter at different positions within the emitter, including centrally, at the top, at the bottom or any other appropriate location. The etch selective material is InGaAlAs ("Al-Q") in an example.

The lightly doped AlInP layer and the etch selective material InGaAlAs (or other Al-Q) are etched in a selective manner in a next stage as part of a wet etch process. This may include the definition of a void which is later filled with, for example, SiNx. A result of the wet etch process is the formation of an emitter ledge at an intermediate position in the emitter. The etch selective layer 210 may be made from InGaAlAs ("Al-Q" where this abbreviation indicates an Al containing quaternary semiconductor material selected from InP-based semiconductor materials), or in examples other arsenide-based material are formed within the graded emitter sandwiched between In(1-x)Al(x)P. The layer 210 is etch selective to the AlInP emitter and the GaAsSb base by an etchant that works selectively on the materials of the emitter or base whatever they may be. Other materials such as InP; In(1-x)Al(x)P; InAl(x)As; In(1-x)Al(x)P and the like may be used in layers adjacent to the etch selective layer. The etch selective material 210, disposed between or within layer 209, is chosen so that a selective wet etch can be used to selectively etch layers 209 and 210 to define an emitter ledge 211 reliably and controllably.

After the selective wet etch further processing steps may take place to complete the required transistor in a manner that will be clear to the person skilled in the art. The epitaxial process may comprise a molecular-beam epitaxy (MBE) process and/or a Metal Organic Chemical Vapor Deposition (MOCVD) process. The etching is described as a wet etch process but other techniques may be used in other examples, or any other epitaxial process which does not degrade the transistor structure already grown.

FIG. 3 and FIG. 4 show examples of an etched and filled area 220 on each side of the emitter ledge 211. The lightly doped AlInP layer and the etch selective material AlInGaAs (or Al-Q) are etched in a selective manner defining a void 220 which is later filled with, for example, SiNx. In FIG. 3 the etch of the lightly doped AlInP layer stops at the top 210a of the emitter ledge 211 and is later filled with, for example, SiNx. In FIG. 4 the etch of the lightly doped AlInGaAs(Al-Q) layer stops at the bottom 210b of the emitter ledge 211 and some of the etch selective material AlInP is etched. The void 220 in this case is larger as it includes the lightly doped AlInP layer and some of the etch selective material AlInGaAs (or Al-Q) and the void is later filled with, for example, SiNx. This means different amounts of material are removed in a controlled manner. The material between the base and the emitter in the area of the emitter ledge includes a material which can be selectively etched relative to a surrounding material. This means a controlled shape, size and profile can be reproduced. The material forming around the ledge is etched and the etching is stopped in such a way as to form a predetermined lithographical form in the materials. The form having a predetermined shape, size and material by controlling the number of etch steps, the depth and the etchant for each etch in an etch-stop process.

By forming the ledge 211 in accordance with an aspect of the invention it is possible to make the ledge manufacturable. This has so far been elusive. The present invention uses a specific technique and materials to achieve this result. Using a material that is selectively etchable relative to the emitter is a factor in the solution. A number of further relevant factors will now be described. InP is a binary material having a known set of naturally occurring physical parameters. One of these is the band-gap energy. The applicant has determined that a certain combinations of InGaAs are lattice matched to InP. For example, it is well known that In(0.53)Ga(0.47)As is lattice matched to InP. In addition, the applicant has determined that a quaternary or quintenary allotrope of InGaAs provides a specific bandgap and a can be lattice matched with InP thus providing a repeatable combination of features which are usable to ensure consistent manufacturability of the ledge. By selecting the material for the ledge to have a combination of repeatable features it is possible to design and form a ledge that is always substantially the same. The features are selected from a combination of the following:

Selecting the ledge material to be selectively etchable such that the etching process is consistent for a predetermined combination of ledge and emitter materials;

Selecting the materials to be substantially lattice matched;

Selecting the materials from a set of Al-Q materials having a conduction band similar to the point in the emitter layer to the ledge etch point (in this case a specific composition of InAlP);

Selecting the position within the emitter material at which the conduction bands are matched with the selected Al-Q material.

To form a reproducible emitter ledge, it is also important to manufacture the ledge structure having a controlled lithographical form in the materials that includes at least one or more of varying shape, size, material and etchant. In an example the profile of the ledge is predetermined and described with reference to FIG. 5 which is a bandgap energy diagram showing conduction band energy $E_c$ and valence band energy $E_v$ of each layer. An InP collector 500 is grown as will be understood by the skilled person. Thereafter the base 502 is applied. A graded emitter layer 504 is then grown. The graded emitter layer 504 comprises "Al-Q", Al(x)In(1-x)P etc . . . The graded emitter layer may be slightly strained, so Ec of the base material (e.g. GaAsSb) matches the Ec of the emitter material (e.g. Al-Q or AlInP). Al-Q refers to materials that are quaternary or in cases quintenary in nature and means they include respectively four or five elements of III-V materials such as In, Ga, As, P, Al, Sb, B, Ti, N, Bi, as examples In an arrangement the emitter ledge layer may comprise a bulk material having a specific structure, such as a quaternary or quintenary structure. In an example this could be InGaAlAs for a quaternary material and any combination of elements forming a quintenary material from the possible materials listed above, including In, Ga, As, P, Al, Sb, B, Ti, N, Bi.

In an example the process enables formation of two sloped regions 506 and 508 separated by an etch selective material 510 in the emitter ledge layers 504. A notch or step 511 may be formed in the emitter ledge 510 which is a consequence of using materials having a quaternary structure such as InGaAlAs. The notch may not be formed if a quintenary materials are used.

The graded emitter layer 504 may alternatively comprise a chirped superlattice to make the grading more controllable as will now be described.

A superlattice is a structure in which alloy semiconductors may be made. For instance, a superlattice of InAs and GaAs with equal period thickness (say 10 Angstroms) repeating for 10 periods can be thought of as an In (0.5) Ga (0.5) As material (for example forming a layer 200 Angstrom thick). If the design is an aperiodic superlattice (i.e. a chirped superlattice) with an increasing InAs period thickness the resulting composition of the alloy semiconductor will have increasing Indium composition, i.e. the composition is graded. Production molecular-beam epitaxy (MBE) may be used to make these compositionally graded alloys. Other factors may be relevant to the production of the superlattice, including but not limited to the strain and the thickness under which the electrons react within the structure.

A chirped superlattice is a superlattice in which the usual periodic structure of layers of two or more material is aperiodic. This has an effect of increasing quantum efficiency over a non-chirped superlattice.

Figure 5:
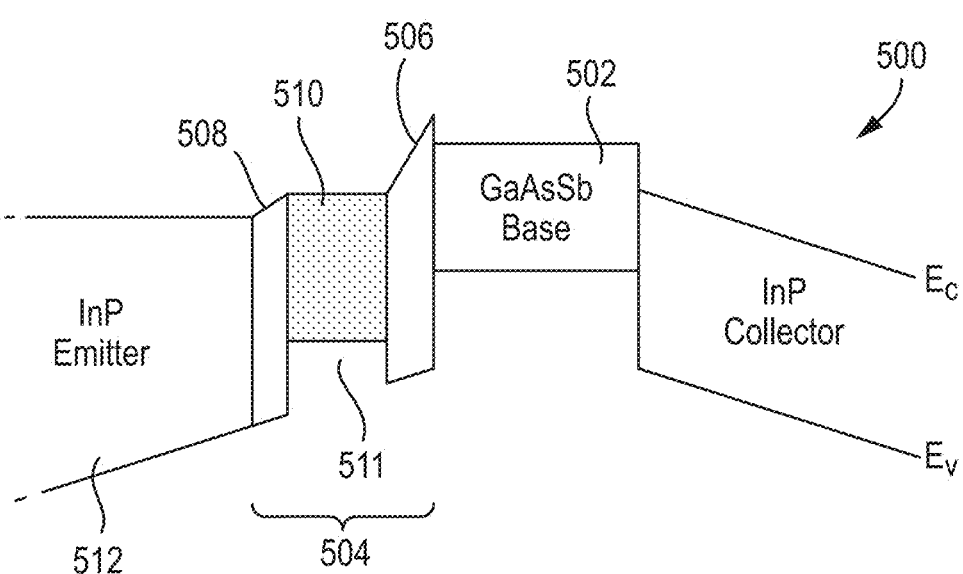
FIG. 5 is a schematic enemy bandgap diagram showing conduction band energies Ec and valence band energies Ev of layers of a transistor comprising an emitter ledge structure as illustrated schematically in FIGS. 2 to 4.

In the bandgap energy diagram is shown in FIG. 5, 510 is the Al-Q layer and the composition is fixed. The composition can be implemented using regular superlattice (because the composition does not change). For layers 506 and 508 the composition of the Al(1-x)In(x)P change (meaning the "x" changes) and using chirped superlattice creates the composition grading.

A chirped superlattice structure of the graded emitter layer 504 allows a precise combination of In(1-x)Al(x)P to be determined so that a ledge can be consistently manufacturable within the graded emitter layer. The exact etch, stop and fill process steps ensure a predetermined profile of the required materials can be designed and built. Lattice matching is used to avoid dislocations within the crystal lattice if the critical Matthew-Blakeslee limit is exceeded. In principle a slight lattice mismatch could be tolerated but choice of materials can mitigate and overcome this.

Using the superlattice structure means that it is possible calculate a precise composition of In(1-x)Al(x)P from known InP conduction band match when compared for a given position on the emitter for the emitter ledge layer composition used.

As stated elsewhere, the emitter ledge layer can be any appropriate material that provides the ability to be selectively etch relative to the materials of the respective juxtapositioned layers. Either after or before the emitter ledge has been formed, an emitter layer 512 may be grown over the emitter ledge layer or the position in which it will be formed. It is noted that the emitter layer may be grown either before or after the etch stop sequence as described elsewhere.

The use of a superlattice materials is helpful when processing is based on MBE as the process steps can be simplified over other techniques.

The ability to make a ledge in a transistor has been shown to be possible. What is not is the ability to reliably and consistently manufacture a ledge. The present invention address this by inserting an etch selective material into a graded emitter layer 504 comprises "Al-Q", Al(x)In(1-x)P etc . . . The graded emitter layer may be slightly strained, so the band energy $E_c$ of the base material (e.g. GaAsSb) matches the band energy $E_c$ of the emitter material (e.g. Al-Q or AlInP).

The HBT of the present invention can be used in many types of systems and devices. One example is electro-photonic devices. These may be found in receivers, transmitters and other devices which use Type-I and Type-II transistors. In examples these may include receivers and transmitters for high-speed communications via optical fiber and the like. To make such devices the HBT may be in a TIA, or in an EAM driver circuitry combined with photonic devices. The following describes examples of monolithically integrated devices which uses HBT transistors according to the invention. In addition to monolithically integrated devices the transistors may be used in hybrid devices such as those including different types of materials, integrated or co-packaged with other electronics, such as CMOS silicon-based devices.

Figure 6:
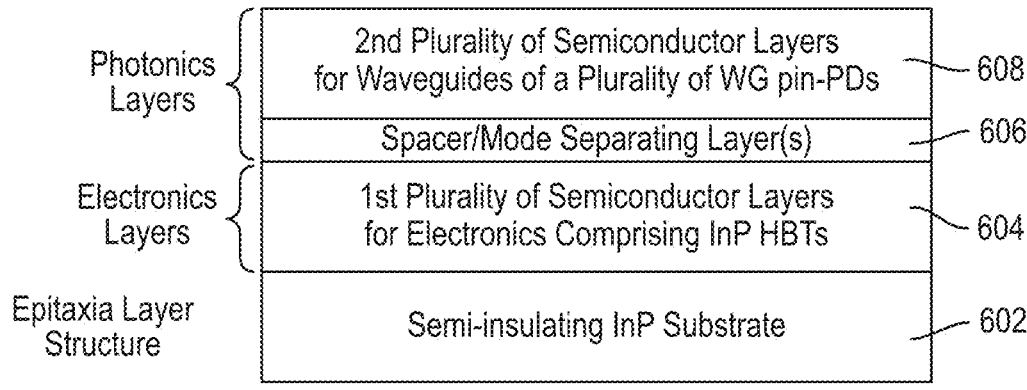
FIG. 6 shows an example epitaxial layer structure for monolithic integration of multiple WG-pin PD with electronic circuitry, e.g. comprising a transistor such as a TIA according to an aspect of the present invention.

FIG. 6 is a simplified schematic cross-sectional view of an epitaxial structure for a monolithically integrated waveguide PD and TIA 600 according to an aspect of the present invention. The monolithic device comprises a semi insulating (SI) III-V material substrates 602. In an example this is SI InP. Electronic layers 604 are added to provide a first plurality of semiconductor layers for electronics comprising InP HBTs in an example. A spacer or mode separating layer(s) 606 separates the first plurality of layers from a second plurality of semiconductor layers for waveguides of a one or more WG-pin PDs 608.

The WG-pin PDs comprise the materials as described elsewhere in this description and generally comprise one or more III-V materials, e.g. an InP-based material system, comprising binary, ternary, quaternary, quintenary and other compositions of In, Ga, As, P, Al, N and Sb. The first plurality of layers comprise electronics and associated functionality, e.g. for fabrication of InP heterojunction bipolar transistors (HBTs). The second plurality of layers comprises photonic layers and associated functionality. For fabrication of WG-pin PDs, the photonics layers comprise an i-region comprising absorption material, sandwiched between an n-InP layer and p-InP layer. In some embodiments, the absorption material of the i-region comprises InGaAs, or a quaternary or quintenary absorption material selected from within the InGaAlAsP quintenary system, which is lattice matched to InP. In some embodiments the absorption material of the i-region comprises a Quantum Confined Stark Effect (QCSE) multi-quantum well (MQW) structure.

Using materials of this nature enables very high-speed modulation to be achieved. A semi-insulating substrate is beneficial in reducing device capacitance. In addition, Quantum Efficiency and other parameters, such as sensitivity, responsivity and dynamic extinction ratio are also improved. For fabrication on an SI substrate there is reduced overall capacitance which improves electrical performance. The receiver has improved sensitivity and responsivity of WG-PIN PD. The transmitter has a dynamic extinction ratio of the EAM which provides improvements over other designs.

Figure 7:
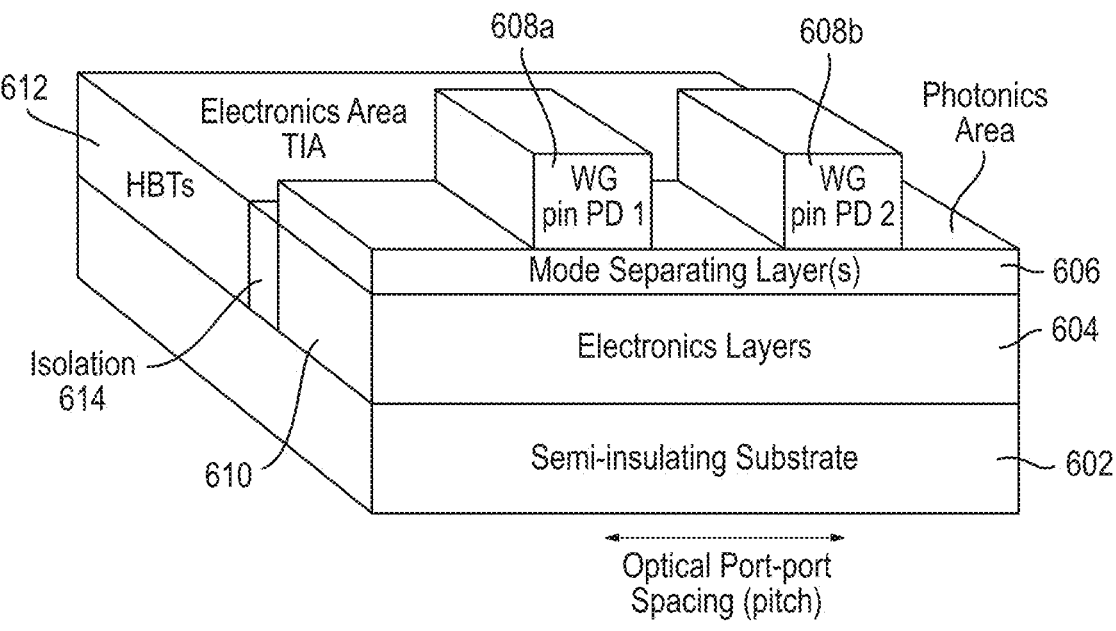
FIG. 7 shows a simplified perspective view of part of a monolithically integrated circuit comprising a plurality of WG-pin PD integrated with electronic circuitry comprising a TIA according to an aspect of the present invention.

FIG. 7 shows a schematic view of part of an optical transmitter which is a device structure comprising first and second WG-pin PDs 608a and 608b and electronic circuitry comprising a TIA, fabricated with HBTs, based on the epitaxial layer structure shown in FIG. 6 structure. Electrical connections between the WG-pin PDs and the TIA are omitted from this diagram. It will be appreciated that in accordance with an aspect of the invention, there are interconnects between any optical device and electronic device according to techniques which will be appreciated by the skilled person. The area of the chip is defined by the semi-insulating substrate 602. Layers 604 includes multiple electronics devices 610 and 612 including but not limited to TIAs and any other drivers or control electronics for any other associated component or device located on the chip. An isolation layer 614 separates the active electronics layers, comprising the electronic circuitry from the remaining electronics layers underlying the photonics layers. Atop the electronics layer is a mode separating layer 606 and two WG-pin PDs 608a and 608b at the mode separating layer 406 and the underlying electronics layers 604. That is, the mode separating layer 606 vertically separates the photonics layers of the WG-pin PD from the remaining underlying electronics layers, and the isolation region laterally separates the photonics structures from the active electronic devices. One or more metallization layers provide electrical connection between each WG-pin PD and a respective TIA (electrical connections not shown in FIG. 7).

Figures 8A, 8B:
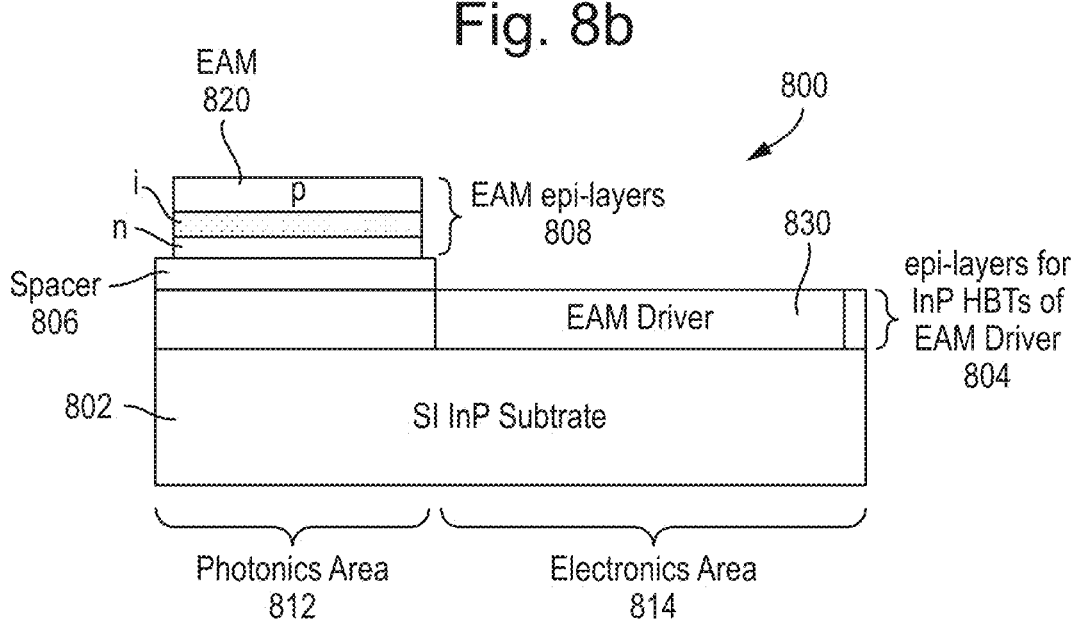
FIG. 8a shows a monolithically integrated electro-absorption modulators (EAM) and EAM Driver chip according to an aspect of the present invention.
FIG. 8b is a simplified cross-sectional view of an epitaxial structure for the FIG. 8a structure.

U.S. Pat. Nos. 10,673,532 and 10,530,484 disclose device structures for monolithic integration of an electro-absorption modulators (EAM) and EAM driver circuitry for an optical transmitter. For example, FIGS. 8a and 8b herein are adapted from FIGS. 3A, 3B and 3C of these patents. FIG. 6a shows a schematic plan view of a monolithic electro-photonic integrated circuit 800 comprising an EAM 820 with integrated EAM driver circuitry 830 which as adapted forms part of a transmitter according to aspects of the invention. FIG. 8b shows a simplified cross-sectional view of an epitaxial layer structure for fabrication of a monolithic electro-photonic integrated circuit 800 comprising an EAM 820 with an integrated EAM driver circuitry 830 of FIG. 8a. FIG. 8b also shows the underlying semi-insulating substrate 802 and a first plurality of semiconductor layers 604 for electronics, comprising InP EAM driver layers, in an example of HBTs. A spacer 806 separates the first plurality of semiconductor layers from a second plurality of semi-conductor layers 808 forming the EAM 820. It will be appreciated that other examples may be used, and the design may vary depending on requirements and processing con-straints such as chip dimension requirements and the like.

In a further optical transmitter according to an aspect of the invention, the transmitter may comprise a monolithically integrated Mach-Zehnder modulator (MZM), and a transis-tor as described herein. The transmitter, whatever, type may include a laser source.

Figure 9:
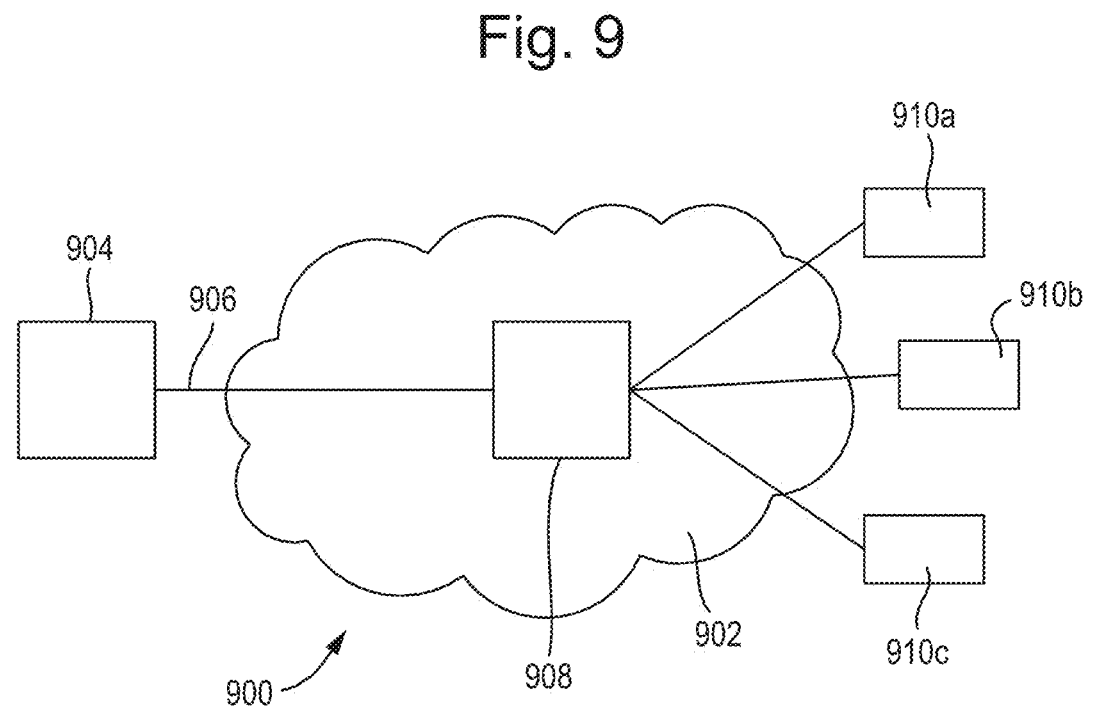

FIG. 9 shows a distributed network system 900, according to an aspect of the present invention and which is configured to transmit and receive signals made up of multiple wave-lengths. For example, applications such as CWDM for high-speed data interconnect, 5G network communications. The system 900 is configured to operate with a network 902 supporting a relevant application. A transmitter 904 at a service provider communicates via an optical signal 906 with receivers 910a, 910b, 910c at respective multiple locations. The network may include a device 908 for direct-ing the transmitted signal to individual receivers. The nature in which this occurs is a beam splitter that can split the input into a plurality of outputs each destined for a particular location. There may be multiple beam splitters in the net-work depending on the nature of the original signal and the destinations. For example, a splitter per customer and a splitter per user.

It will be appreciated that the transmitter 904 may include equivalent beam combiners or reverse beam splitters to combine multiple beams into a composite signal optical for transmission across the network. The transmitter may also include laser devices or modulators to generate the optical signal to be transmitted to the receivers, this is described in greater detail above.

The system may include other devices and components as required including but not limited to transistors for all or any device in the system.

Fabrication comprises providing an epitaxial layer struc-ture in which an HBT epi-layer structure is provided on the substrate, with an overlying PIN epi-layer structure. That is the TIA circuitry comprising InP HBTs is fabricated on the SI InP substrate, for high-speed operation of the HBT. The PIN comprising an InGaAs absorption layer may be formed by overlying epitaxial layers, separated by a spacer layer, so the optical performance of the photonics devices is not degraded by the underlying conductive layers of TIA cir-cuitry, and the speed and performance of the underlying TIA circuitry can be optimized independently. Also, since the HBT epi-layers of the epitaxial layer stack forming the HBT electronics are distinct from the PIN epi-layers of the epitaxial layer stack forming the PIN, each can be optimized separately. If required a spacer comprising one or more intermediate layers between the HBT epi-layers and the PIN epi-layers may be provided, e.g. to provide electrical isola-tion, to act as an etch stop to facilitate processing, etc.

As illustrated schematically, the area of the TIA circuitry may be isolated from the area of the PIN by a dielectric filled trench. By integration of the HBT electronic circuitry for the TIA and the PIN detector as illustrated schematically, layers of the HBT epi-layer stack and layers of the PIN epi-layer stack may be independently structured and optimized for improved device performance. If required, materials of the epitaxial layer structure may be selected to be compatible with a single epitaxial growth, or alternatively, multiple epitaxial growths may be used, as appropriate. Different processes may be used for fabrication of the HBT epi-layers and PIN epi-layers. For example, in practice, MBE (Molecu-lar Beam Epitaxy) may be used to provide the HBT epi-layers, and MOCVD (Metal Organic Chemical Vapor Depo-sition) may be used to provide the PIN epi-layers. A semi-insulating spacer may be provided between the HBT epi-layers and the PIN epi-layers. In other embodiments, it is preferred to select an epitaxial layer structure for the HBTs and the PIN which is compatible with single epitaxial layer growth.

In designing the TIA, reducing capacitance allows for a higher transimpedance feedback resistance RF, to increase gain, and the TIA noise is inversely proportional to the feedback resistance RF. It may be beneficial to match the capacitance of the TIA to the device capacitance of the PIN. Since there are a number of parameters that can be adjusted to achieve the required PIN-TIA performance, it may not be necessary to minimize the capacitance of the PIN. With respect to the ground pads of the PIN, it may be beneficial to use multiple pads, e.g. two pads will double capacitance, and halve inductance, e.g. use of multiple wire bonds for the ground pads reduces bond wire inductance (e.g. ~1 nH/mm for 25 μm bond wires). In designing the PIN, if the respon-sivity, i.e. A/W, of the PIN is made high enough, so that the SNR in the PIN is higher, the PIN provides a higher input signal to the TIA. This means even if the TIA is noisier (e.g. from lower RF, from higher capacitance) the integrated PIN-TIA will provide improved SNR.

Monolithic integration of an InGaAs PIN using InP HBTs for the TIA provides a solution to a problem that is not easily solvable with silicon photonics comprising normal inci-dence, e.g. front-entry geometry, Germanium (Ge) PINs.

The monolithic integration approach described herein for reducing parasitic capacitances of the photodiode detector, and then adjusting other parameters of the PIN and TIA to improve quantum efficiency, e.g. to meet sensitivity and responsivity specification for high data rate applications may also be extendible to other types of photodiode detectors, e.g. unitary transit carrier (UTC) photodiode device struc-tures and waveguide PIN geometries, et al.

Monolithic integration of the PIN-TIA eliminates hybrid integration parasitics such as, bond pad capacitances, wire-bond resistance/inductance/etc., and direct interconnection of the PIN-TIA provides lower capacitance by eliminating bond pad capacitance, and provides a direct (short-length) lower inductance/lower resistance interconnection. Reduced bond pad capacitance provides associated degrees of free-dom to provide improved bandwidth for a PIN of given dimensions and reduced noise. This also provides a very thin, compact device.

The SI substrate is beneficial in reducing device capaci-tance. In addition, Quantum Efficiency and other param-eters, such as sensitivity, responsivity and dynamic extinc-tion ratio are also improved. For fabrication on an SI substrate there is reduced overall capacitance which improves electrical performance. The receiver has improved sensitivity and responsivity of, for example, a WG-PIN PD. The transmitter has a dynamic extinction ratio of, for example an electro-absorption modulators (EAM) which provides improvements over other designs.

The present invention thus provides an improved DHBT which overcomes or mitigates at least some of the problems with known approaches and which is suitable next generation high-speed modulation schemes 112 gb, 224 Gb/s PAM4 modulation, 224 gb, 448 Gb/s PAM4 modulation applications, any high-speed data interconnects within data centers and between data centers, passive optical networks (PON), 5G network communications (i.e. an optical core network connected to 5G wireless access) and the like.

While particular implementations and applications of the present invention have been illustrated and described, it is to be understood that the present invention is not limited to the precise construction and compositions disclosed herein and that various modifications, changes, and variations can be apparent from the foregoing descriptions without departing from the spirit and scope of an invention as defined in the appended claims.

What is claimed is:

1. A heterojunction bipolar transistor comprising a plurality of semiconductor layers, selected from an InP-based materials system, arranged to form a base, an emitter and a collector wherein the emitter has a graded emitter structure comprising an emitter ledge, the emitter ledge comprising a layer of an etch selective material which is selectively etchable relative to at least one of the materials of the emitter and the base:

wherein the collector and the emitter comprise InP, the base comprises GaAsSb, the emitter ledge comprises InAlP, and wherein the etch selective material is of the emitter ledge and is selected from a set of Al containing quaternary semiconductor materials (Al-Q) of said InP-based materials system, having a conduction band-similar to a point in the emitter layer at a ledge etch point for a specific composition of InAlP.

2. The transistor of claim 1, wherein materials of the emitter ledge and the emitter are substantially lattice matched.

3. The transistor of claim 1, wherein a position of the etch selective material within the emitter material is where a conduction band of the emitter is matched with a conduction band of the Al-Q material.

4. The transistor of claim 1, wherein the emitter ledge comprises a bulk material or a superlattice material.

5. The transistor of claim 4, wherein the superlattice material comprises a chirped superlattice.

6. The transistor of claim 1, wherein the etch selective material is located intermediate the graded emitter structure to form the emitter ledge.

7. The transistor of claim 1, wherein the emitter ledge has a predetermined bandgap energy profile including one or more of: at least two sloped regions separated by an intermediate region ("notch") of the emitter ledge.

8. The transistor of claim 1, wherein the emitter ledge comprises a graded emitter comprising a lightly doped AlInP layer and the etch selective material extends through the lightly doped AlInP layer.

9. The transistor of claim 1, wherein the base material comprises GaAs(x)Sb(1-x).

10. The transistor of claim 1, wherein the graded emitter comprises In(1-x)Al(x)P, the etch selective material is InGaAlAs and the etch selective material is sandwiched between the In(1-x)Al(x)P.

11. The transistor of claim 1, wherein the layers on at least one side of the emitter ledge comprise GaAs(x)Sb(1-x) or other arsenide-based material.

12. The transistor of claim 11, wherein the layers of arsenide-based material are on either side of the emitter ledge.

13. The transistor of claim 1, wherein the transistor is a transistor of one of a Transimpedance Amplifier (TIA) in an optical receiver and an Electro-Absorption Modulator (EAM) driver in an optical transmitter.

14. An electro-photonic device comprising one of a monolithically integrated photodiode (PD); a monolithically integrated Electro-Absorption Modulator (EAM) or a mono-lithically integrated Mach-Zehnder modulator (MZM) and electronics comprising a transistor according to claim 1.

15. The electro-photonic device of claim 14, wherein the device is a receiver and wherein the transistor comprises a Transimpedance Amplifier (TIA).

16. The electro-photonic device of claim 15, wherein an epitaxial layer stack is formed on a semi-insulating (SI) InP substrate;

the TIA comprises heterojunction bipolar transistors (HBT) formed by a first plurality of semiconductor layers of the epitaxial layer stack formed on the SI substrate;

the PD comprises a p-i-n diode (PIN) formed by a second plurality of semiconductor layers of the epitaxial layer stack overlying the first plurality of semiconductor layers, the second plurality of semiconductor layers comprising an n-layer, an i-layer and a p-layer; and a p-contact of the PIN diode is directly interconnected by a conductive trace to an input of the TIA.

17. The electro-photonic device of claim 16 further comprising a spacer comprising one or more intermediate layers comprising a semi-insulating layer between the first plurality of semiconductor layers and the second plurality of semiconductor layers.

18. The electro-photonic device of claim 17, wherein the TIA is formed on a first area of the substrate, and the PIN is provided on an adjacent area and comprising an isolation region electrically isolating the first plurality of semiconductor layers of the first area from the first plurality of semiconductor layers of the adjacent area.

19. The electro-photonic device of claim 14, wherein the device is a transmitter and wherein the transistor comprises a transistor of an Electro-Absorption Modulator (EAM) driver.

20. The electro-photonic device of claim 19, further comprising a plurality of semiconductor layers formed on a semi-insulating (SI) substrate, the plurality of semiconductor layers comprising a first plurality of semiconductor layers defining an optical waveguide forming at least part of the EAM; and a second plurality of semiconductor layers comprising EAM driver layers.

21. The electro-photonic device of claim 20, further comprising a spacer separating the first plurality of semiconductor layers from the second plurality of semiconductor layers.

22. The electro-photonic device of claim 19, further comprising a laser or a laser source.

23. An optical system comprising at least one electro-photonic device as defined in claim 14.

24. The optical system of claim 23, comprising two or more electro-photonic devices.

25. A method a manufacturing a transistor according to claim 1, the method comprising: growing a collector and a base;

forming a graded emitter over the base;

providing an etch selective material intermediately through the graded emitter;

performing a selective etch of the graded emitter and the etch selective material to form an emitter ledge at an intermediate position in the graded emitter.

26. The method of claim 25, further comprising one or more of:

growing the collector and base by one or more epitaxial growth process stages; forming a graded emitter over the base from a combination of layers;

forming the graded emitter to comprise a lightly doped AlInP layer and a heavily doped InP layer;

etching selective the graded emitter or the base by an etchant that works selectively on the materials of the graded emitter or the base;

selecting the etch selective material, so that a selective wet etch can be used to selectively etch layers to define the emitter ledge consistently for a predetermined combination of emitter ledge and emitter material;

wherein the epitaxial process comprises one of a molecular-beam epitaxy (MBE) process or a Metal Organic Chemical Vapor Deposition (MOCVD) process.

27. The method of claim 25, wherein the etch selective material comprises one of InGaAlAs and another Al containing quaternary semiconductor material selected from InP-based semiconductor materials.

28. The transistor of claim 1 wherein the semiconductor layers comprise layers included in the table:

| Description | Material |
| --- | --- |
| Emitter metal | Ti/Pt/Au |
| Cap | $In(x)Ga(1-x)As$ |
| Emitter | InP |
| Emitter | $In(1-x)Al(x)P$ |
| Emitter etch selective layer | AlInGaAs or other (Al-Q) |
| Emitter/ledge | $In(1-x)Al(x)P$ |
| Base | $GaAs(x)Sb(1-x)$ |
| Collector | InP |
| Sub-collector | InP |
| Sub-collector | $In(x)Ga(1-x)As$ |
| Sub-collector | InP |
| Etch stop | $In(x)Ga(1-x)As$ |
| Substrate | InP (SI) | wherein Al-Q comprises Al containing quaternary semiconductor material selected from InP-based semiconductor materials.

\* \* \* \* \*